US012106975B2

(12) United States Patent
Guo

(10) Patent No.: US 12,106,975 B2
(45) Date of Patent: Oct. 1, 2024

(54) SEMICONDUCTOR DEVICE AND CLEANING SYSTEM

(71) Applicant: CHANGXIN MEMORY TECHNOLOGIES, INC., Hefei (CN)

(72) Inventor: Chao Guo, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 484 days.

(21) Appl. No.: 17/490,040

(22) Filed: Sep. 30, 2021

(65) Prior Publication Data

US 2022/0238356 A1 Jul. 28, 2022

Related U.S. Application Data

(63) Continuation of application No. PCT/CN2021/111844, filed on Aug. 10, 2021.

(30) Foreign Application Priority Data

Jan. 26, 2021 (CN) .......................... 202110105673.3

(51) Int. Cl.
*C23C 16/44* (2006.01)
*B08B 5/00* (2006.01)
(Continued)

(52) U.S. Cl.
CPC .......... *H01L 21/67028* (2013.01); *B08B 5/00* (2013.01); *H01L 21/02063* (2013.01)

(58) Field of Classification Search
CPC ........... H01L 21/67028; H01L 21/0209; H01L 21/02301; H01L 21/02661; B08B 5/00
See application file for complete search history.

(56) References Cited

U.S. PATENT DOCUMENTS

| 9,103,030 B2 | 8/2015 | Kato |
| 10,612,135 B2 | 4/2020 | Baluja et al. |

(Continued)

FOREIGN PATENT DOCUMENTS

| CN | 101748387 A | 6/2010 |
| CN | 102485953 A | 6/2012 |

(Continued)

OTHER PUBLICATIONS

Second Office Action of the Chinese application No. 202110105673.3, issued on Dec. 12, 2023. 14 pages with English translation.

*Primary Examiner* — Walter H Swanson
*Assistant Examiner* — Jacob T Nelson
(74) *Attorney, Agent, or Firm* — Kilpatrick Townsend & Stockton LLP

(57) ABSTRACT

A semiconductor device and cleaning system are provided. The semiconductor device includes: a device chamber, supporting column and bearing platform in the device chamber, the supporting column being configured to support the bearing platform; and an air outlet, first and second air inlet assemblies on the device chamber, the first and second air inlet assemblies being configured to introduce clean gas into the device chamber, and the air outlet being configured to discharge gas in the device chamber. The first and second air inlet assemblies are separately provided on the device chamber on the upper and lower sides of a bearing surface of the bearing platform; and one of the first and second air inlet assemblies is configured to clean the device chamber on a side of the bearing surface away from the supporting column, and other is configured to clean a gap between the supporting column and device chamber.

17 Claims, 7 Drawing Sheets

(51) Int. Cl.
*H01L 21/02* (2006.01)
*H01L 21/67* (2006.01)

(56) References Cited

U.S. PATENT DOCUMENTS

| | | |
|---|---|---|
| 10,636,628 B2 | 4/2020 | Ghosh et al. |
| 2010/0132615 A1 | 6/2010 | Kato |
| 2018/0023193 A1 | 1/2018 | Baluja et al. |
| 2019/0080889 A1 | 3/2019 | Ghosh et al. |
| 2020/0141000 A1* | 5/2020 | Kim .................. C23C 16/45574 |
| 2020/0251311 A1 | 8/2020 | Ghosh et al. |

FOREIGN PATENT DOCUMENTS

| | | |
|---|---|---|
| CN | 104752258 A | 7/2015 |
| CN | 107034446 A | 8/2017 |
| CN | 108048820 A | 5/2018 |
| CN | 111029282 A | 4/2020 |
| CN | 210378981 U | 4/2020 |
| KR | 200153146 Y1 * | 8/1999 |
| KR | 20150077852 A | 7/2015 |

* cited by examiner

SEMICONDUCTOR DEVICE AND CLEANING SYSTEM

CROSS-REFERENCE TO RELATED APPLICATIONS

The present application is a continuation of International Patent Application No. PCT/CN2021/111844, filed on Aug. 10, 2021, which is submitted based on Chinese Patent Application No. 202110105673.3, filed on 26 Jan. 2021, and claims priority to the Chinese patent application. The disclosures of International Patent Application No. PCT/CN2021/111844 and Chinese Patent Application No. 202110105673.3 are incorporated herein by reference in their entireties.

BACKGROUND

A Chemical Vapor Deposition (CVD) process is widely used in semiconductor processing. Presently, the CVD process is typically performed by a CVD machine. Due to design defects of an original CVD machine, clean gas during the processing is introduced from the top of the CVD machine to realize cleaning of the CVD machine. However, it is difficult for the clean gas to clean a bottom gap of the CVD machine, so that after the CVD machine executes the process flow for a long time, a large amount of impurities are prone to accumulation at the bottom of the machine.

The impurities accumulated at the bottom of the machine may be raised in the production process along with the introduction of the process gas, falling on a wafer in which the CVD process is being performed, thereby contaminating the wafer product, and directly causing the product to be scrapped. In addition, the impurities attached to the wafer may continue to contaminate other semiconductor chambers along with continued execution of the process.

In order to ensure the deposition environment inside the CVD machine, related personnel would generally manually clean the CVD machine during the maintenance of the CVD machine, to clear the deposition impurities inside the machine. After the CVD machine executes the process flow for a long time, a large amount of impurities are accumulated at the bottom of the machine, so that the maintenance period of the CVD machine is shortened, and the maintenance of the CVD machine consumes a large amount of time, thereby reducing the production efficiency of the wafer product. Therefore, how to complete the cleaning of the bottom gap of the CVD machine without reducing the production efficiency of the product is the problem to be solved at present.

SUMMARY

The present disclosure relates to the field of semiconductor processing, and in particular, to a semiconductor device and a cleaning system.

Embodiments of the present disclosure provide a semiconductor device and a cleaning system.

In order to solve the technical problem above, the embodiments of the present disclosure provide a semiconductor device, including: a device chamber, and a supporting column and a bearing platform located in the device chamber, the supporting column being configured to support the bearing platform; and an air outlet, a first air inlet assembly, and a second air inlet assembly provided on the device chamber, the first air inlet assembly and the second air inlet assembly being configured to introduce clean gas into the device chamber, and the air outlet being configured to discharge gas in the device chamber. The first air inlet assembly and the second air inlet assembly are separately provided on the device chamber on the upper and lower sides of a bearing surface of the bearing platform; and one of the first air inlet assembly and the second air inlet assembly is configured to clean the device chamber on a side of the bearing surface away from the supporting column, and other assembly is configured to clean a gap between the supporting column and the device chamber.

The embodiments of the present disclosure further provide a cleaning system, in addition to the semiconductor device, further including: an air supply device and an air suction pump, the air supply device being configured to supply clean gas. The air supply device is connected to a first air inlet assembly and a second air inlet assembly of the semiconductor device and is configured to introduce the clean gas into a device chamber of the semiconductor device; and the air suction pump is connected to an air outlet of the semiconductor device and is configured to suction out gas in the device chamber.

BRIEF DESCRIPTION OF THE DRAWINGS

One or more embodiments are described by way of examples with reference to the corresponding figures in the accompanying drawings. Unless otherwise particularly stated, the figures in the accompanying drawings are limited to a scale.

DETAILED DESCRIPTION

Figure 1:
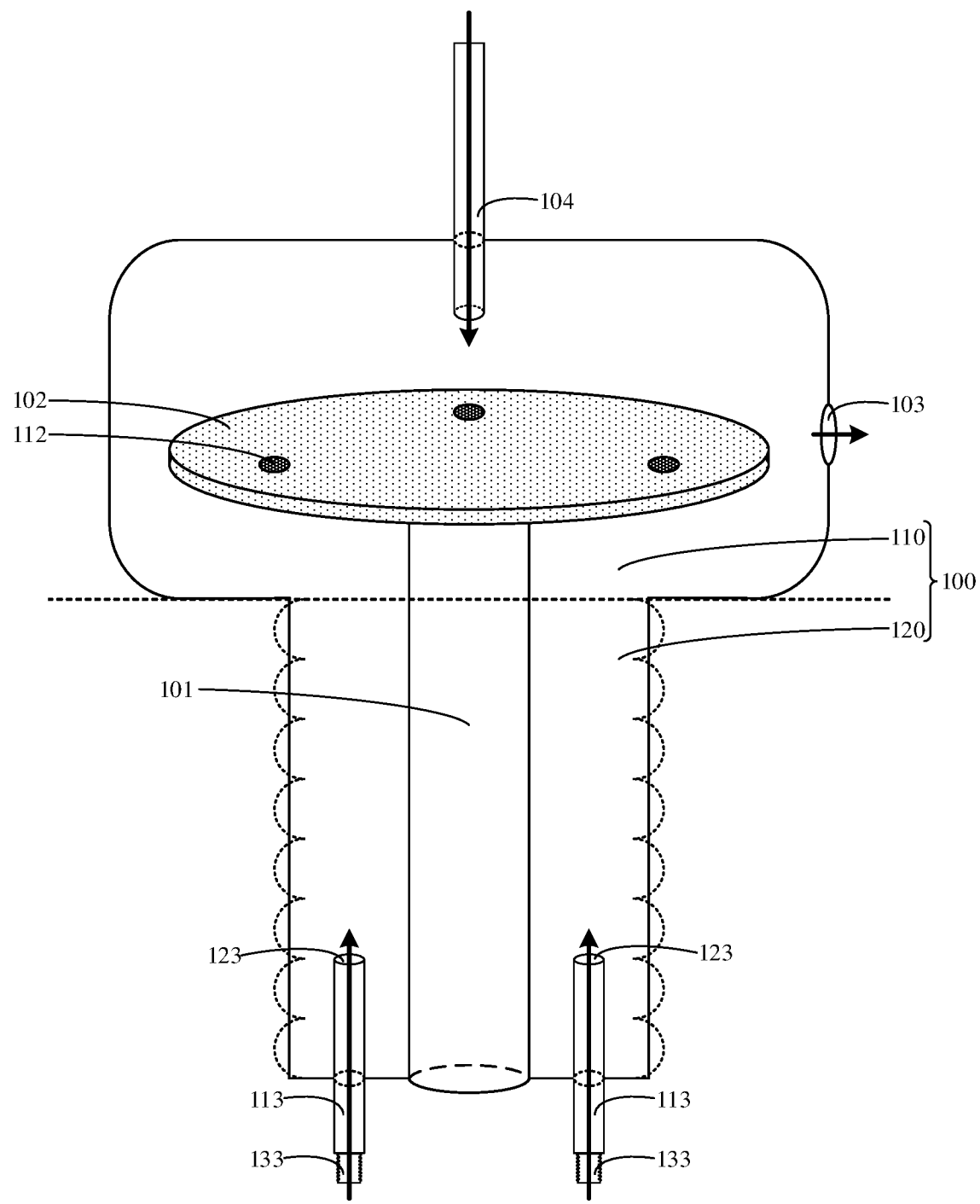
FIG. 1 is a schematic structural diagram of a semiconductor device provided by one embodiment of the present disclosure.

Presently, the impurities accumulated at the bottom of the machine may be raised in the production process along with the introduction of the process gas, falling on a wafer in which the CVD process is being performed, thereby contaminating the wafer product, and directly causing the product to be scrapped.

In addition, the impurities attached to the wafer may continue to contaminate other semiconductor chambers.

In order to ensure the deposition environment inside the CVD machine, related personnel would generally clean the CVD machine during the maintenance of the CVD machine, so as to clear the deposition impurities inside the machine. After the CVD machine executes the process flow for a long time, a large amount of impurities are accumulated at the bottom of the machine, so that the maintenance period of the CVD machine is shortened, and the maintenance of the CVD machine consumes a large amount of time, thereby reducing the production efficiency of the wafer product.

In order to solve the problem above, the embodiments of the present disclosure provide a semiconductor device, including: a device chamber, and a supporting column and a bearing platform located in the device chamber, the supporting column being configured to support the bearing platform; and an air outlet, a first air inlet assembly, and a second air inlet assembly provided on the device chamber, the first air inlet assembly and the second air inlet assembly being configured to introduce clean gas into the device chamber, and the air outlet being configured to discharge gas in the device chamber. The first air inlet assembly and the second air inlet assembly are separately provided on the device chamber on the upper and lower sides of a bearing surface of the bearing platform; and one of the first air inlet assembly and the second air inlet assembly is configured to clean the device chamber on a side of the bearing surface away from the supporting column, and other assembly is configured to clean a gap between the supporting column and the device chamber.

To describe the purpose, the technical solutions and the advantages of the embodiments of the present disclosure more clearly, the embodiments of the present disclosure are described in details below in conjunction with the accompanying drawings. However, persons skilled in the art would understand that in the embodiments of the present disclosure, a number of technical details are described in the following description for readers to better understand the present disclosure. However, the technical solutions of the present disclosure may also be implemented even if in the absence of the technical details and various changes and modifications based on the following embodiments. A division of the following embodiments is for convenience of description, and should not constitute any limitation to specific implementations of the present disclosure, and various embodiments may be combined and referenced with each other without contradiction.

Figure 2:
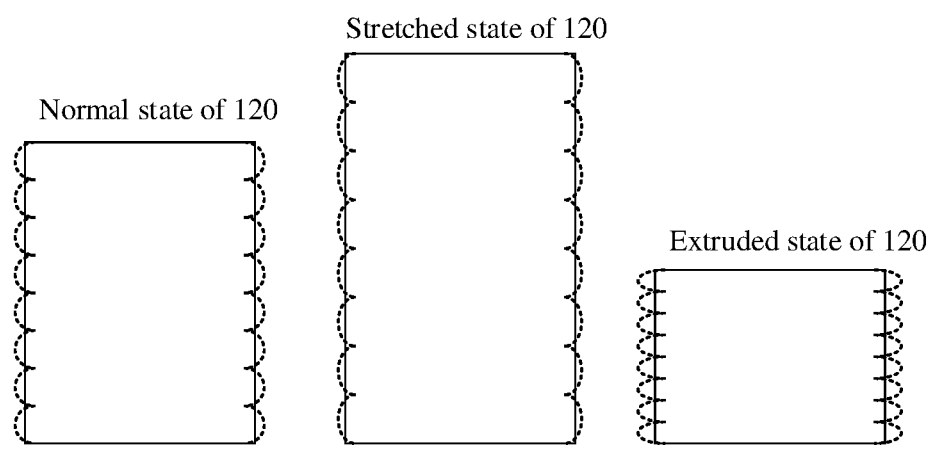
FIG. 2 is a schematic structural diagram of bottom chamber stretching or contraction provided by one embodiment of the present disclosure.

FIG. 1 is a schematic structural diagram of a semiconductor device provided by this embodiment. FIG. 2 is a schematic structural diagram of bottom chamber stretching or contraction provided by this embodiment. FIG. 3 to FIG. 6 are schematic structural diagrams of a first air inlet assembly implementation mode provided by this embodiment. FIG. 7 is a cross-sectional view of separate cleaning pipelines provided by this embodiment. The semiconductor device provided by this embodiment is descried in details below in conjunction with the accompanying drawings. Specific details are as follows.

Referring to FIG. 1, the semiconductor device includes: a device chamber 100, and a supporting column 101 and a bearing platform 102 located in the device chamber 100. The supporting column 101 is configured to support the bearing platform 102.

In this embodiment, the device chamber 100 includes a top chamber 110 and a bottom chamber 120, and the width of the top chamber 110 is greater than that of the bottom chamber 120 in a plane parallel to the bearing surface. The bearing platform 102 is located in the top chamber 110, the supporting column 101 is partially located in the top chamber 110 and partially located in the bottom chamber 120, and the size of the supporting column 101 is less than that of the bearing platform 102 in a plane parallel to the bearing surface.

It is to be noted that the top chamber 110 and the bottom chamber 120 provided by this embodiment are merely illustrative of the device chamber and do not constitute a limitation to the device chamber 100. In other embodiments, the device chamber may be a single chamber. In addition, the width limitation of the top chamber 110 and the bottom chamber 120 in this embodiment is merely illustrative of the device chamber 100, and does not constitute a limitation to the top chamber 110 and the bottom chamber 120. In other embodiments, this embodiment is also applicable to the device chamber having a bottom chamber width greater than or equal to a top chamber width.

The bearing platform 102 is provided with a bearing assembly 112 which is configured to bear a wafer placed on the bearing platform 102, and the semiconductor device is configured to perform related processes on the wafer placed on the bearing platform 102.

The semiconductor device further includes: an air outlet 103, a first air inlet assembly 113, and a second air inlet assembly 104 provided on the device chamber 100. The first air inlet assembly 113 and the second air inlet assembly 104 are configured to introduce clean gas into the device chamber 100, and the air outlet 103 is configured to discharge gas in the device chamber 100.

Specifically, the first air inlet assembly 113 and the second air inlet assembly 104 are respectively provided on the device chamber 100 on the upper and lower sides of a bearing surface of the bearing platform 102. One of the first air inlet assembly 113 and the second air inlet assembly 104 is configured to clean the device chamber 100 on the side of the bearing surface away from the supporting column 101, and other assembly is configured to clean a gap between the supporting column 101 and the device chamber 100. The first air inlet assembly 113 or the second air inlet assembly 104 for cleaning the gap between the supporting column 101 and the device chamber 100 is further configured to clean the bottom of the top chamber 110.

In this embodiment, the first air inlet assembly 113 is provided at the bottom of the bottom chamber 120, and the second air inlet assembly 104 is provided at the top of the top chamber 110. The first air inlet assembly 113 and the air outlet 103 form a first airflow circulation, the second air inlet assembly 104 and the air outlet 103 form a second airflow circulation, and the first airflow circulation and the second airflow circulation are configured to clean the device chamber 100 on the upper and lower sides of the bearing surface respectively, thereby realizing simultaneous removal of top contamination and bottom contamination of the device chamber 100. It is to be noted that, in other embodiments, the first air inlet assembly may be provided at the top of the top chamber, and the second air inlet assembly may be provided at the bottom of the bottom chamber. The specific positions of the first air inlet assembly 113 and the second air inlet assembly 104 provided by this embodiment are merely illustrative of the semiconductor device provided by this embodiment and do not constitute a limitation to the semiconductor device.

Specifically, the first air inlet assembly 113 includes through holes 123 provided between the supporting column 101 and the device chamber 100, and the through holes 123 are configured to discharge the clean gas in the first air inlet assembly 113.

Figure 3:
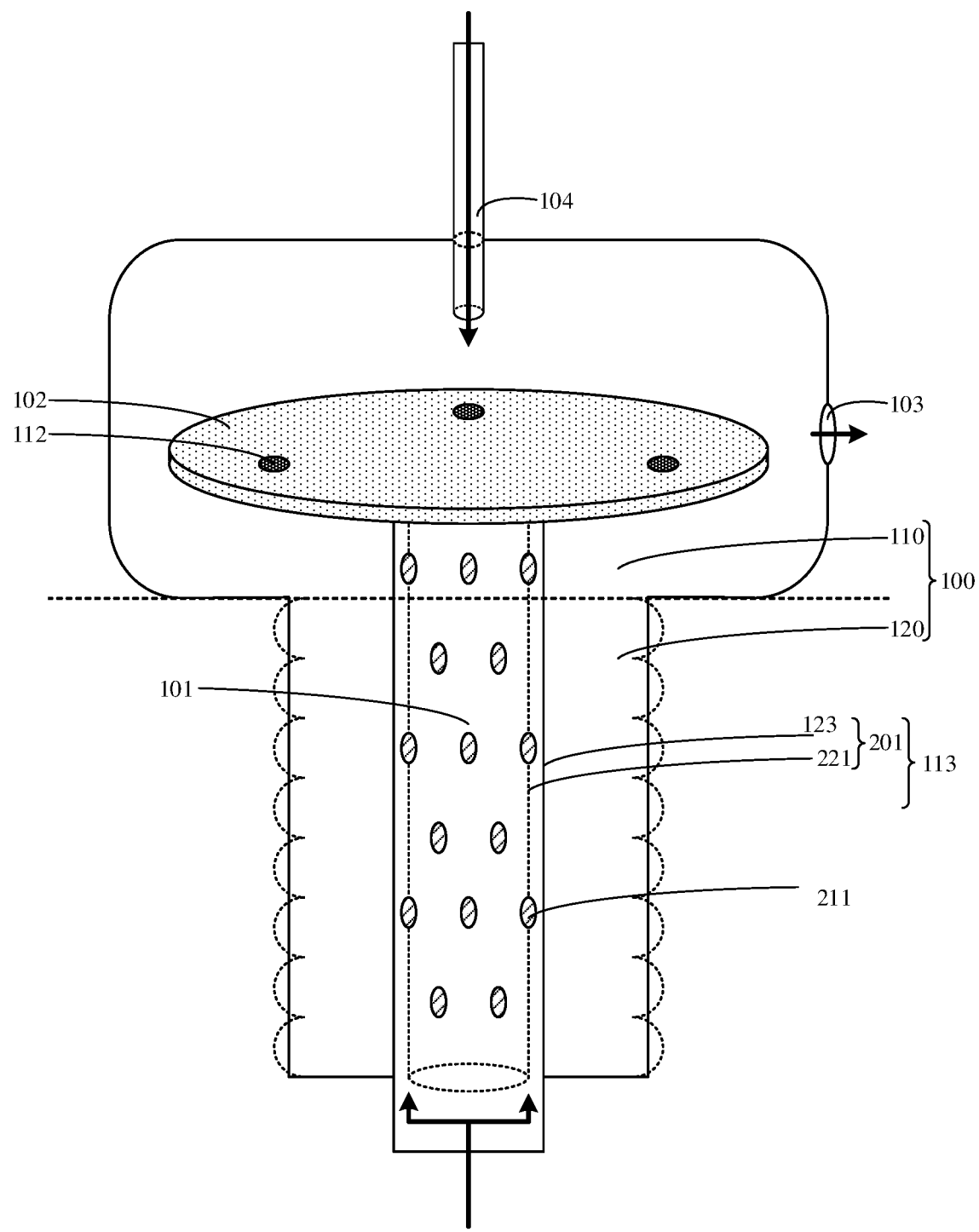
FIG. 3 to FIG. 6 are schematic structural diagrams of a first air inlet assembly implementation mode provided by one embodiment of the present disclosure.
Figure 4:
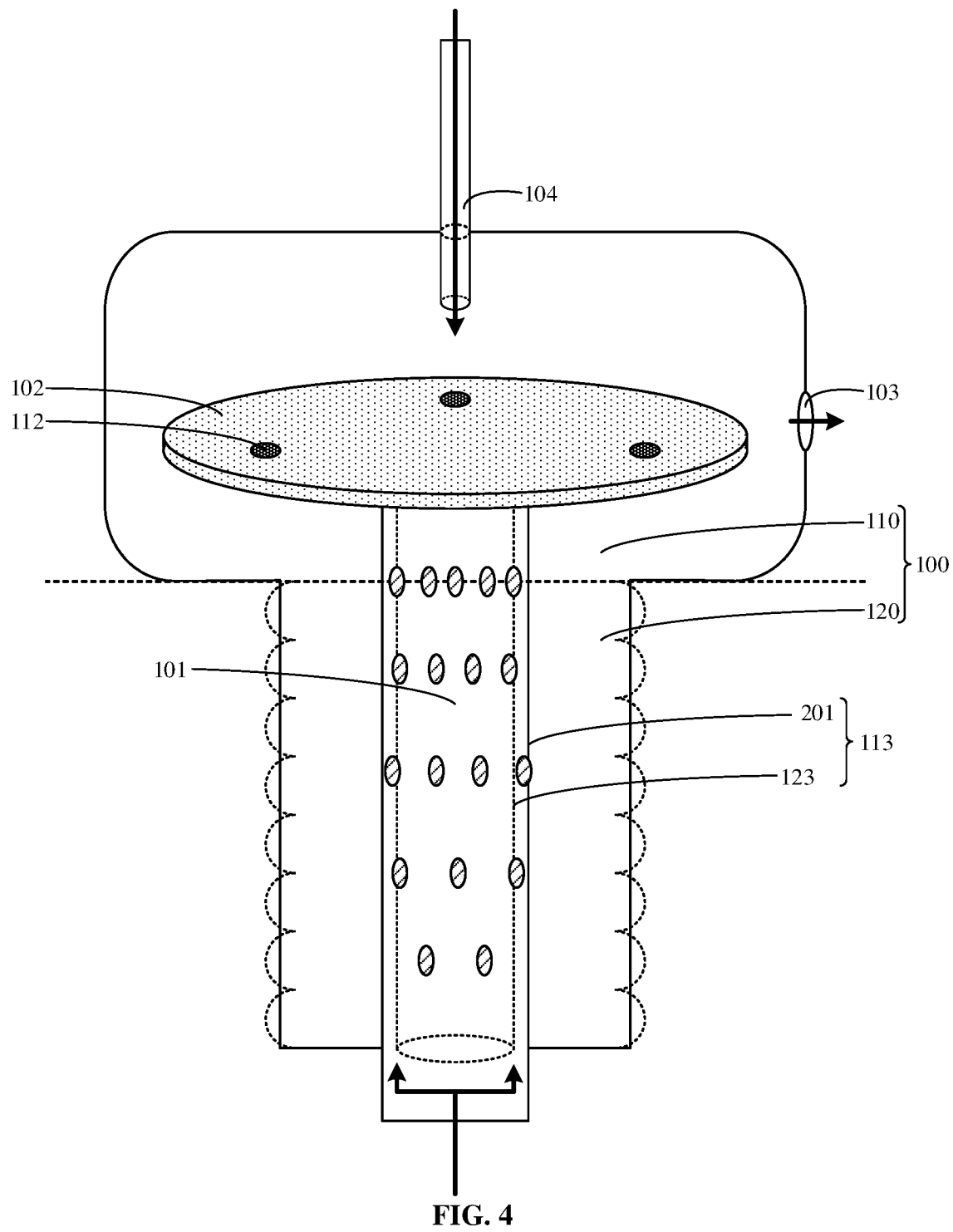

Referring to FIG. 3 and FIG. 4, in an example, the first air inlet assembly 113 includes a cleaning pipe 201 nested on the supporting column 101. The cleaning pipe 201 has a plurality of separate through holes 123, and the through holes 123 are configured to discharge the clean gas in the cleaning pipe 201.

Specifically, the spacing between the through holes 123 is 10-20 mm, e.g., 12 mm, 15 mm, or 18 mm. In this embodiment, the spacing between the through holes 123 is 15 mm. When the spacing between the through holes 123 is greater than 20 mm, the number of the through holes 123 located on the cleaning pipe 201 is reduced. Since the through holes 123 serve as air outlet holes of the cleaning pipe 201, the air outlet area of the cleaning pipe 201 is reduced. When the introduction flow rate of the clean gas is constant, the area of the through holes 123 corresponding to the bottom chamber 120 is small, and the overall cleaning effect of the bottom chamber 120 is poor. When the spacing between the through holes 123 is less than 10 mm, the number of the through holes 123 located on the cleaning pipe 201 is increased. Since the through holes 123 serve as air outlet holes of the cleaning pipe 201, the air outlet area of the cleaning pipe 201 is increased. When the introduction flow rate of the clean gas is constant, the air outlet flow rate of the through holes 123 is small, and the cleaning effect of the chamber wall of the bottom chamber 120 corresponding to the through holes 123 is poor.

In addition, the width of each through hole 123 is 3-7 mm, e.g., 3 mm, 4 mm, or 5 mm. In this embodiment, the width of each through hole 123 is 5 mm. When the width of each through hole 123 is greater than 7 mm, and the introduction flow rate of the clean gas is constant, the air outlet flow rate of the through holes 123 is small, and the cleaning effect of the chamber wall of the bottom chamber 120 corresponding to the through holes 123 is poor. When the width of each through hole 123 is less than 3 mm, and the introduction flow rate of the clean gas is constant, the area of the through hole 123 corresponding to the bottom chamber 120 is small, and the overall cleaning effect of the bottom chamber 120 is poor.

In addition, in a direction perpendicular to the bearing surface, the height difference between the through hole 123 at the highest position and the bearing surface is 3-10 mm, e.g., 5 mm, 7 mm, or 9 mm. The through hole 123 at the highest position is close to the bearing surface, thereby ensuring the chamber effect of the device chamber 100 below the bearing surface.

In this embodiment, the density of the through holes 123 on the cleaning pipe 201 close to the bearing platform 102 is greater than that of the through holes 123 on the cleaning pipe 201 away from the bearing platform 102. That is, the number of the through holes 123 on the cleaning pipe 201 at the bottom of the bottom chamber 120 is small, and the number of the through holes 123 on the cleaning pipe 201 at the top of the bottom chamber 120 is large. Such arrangement of the through holes 123 improves the cleaning efficiency of the clean gas on the bottom of the bottom chamber 120. In addition, a larger number of through holes 123 on the cleaning pipe 201 at the top of the bottom chamber 120 improve the cleaning efficiency of impurities accumulated at the connection surface of the bottom chamber 120 and the top chamber 110.

In other embodiments, the density of the through holes on the cleaning pipe close to the bearing platform is greater than that of the through holes in the middle of the cleaning pipe, and the density of the through holes on the cleaning pipe away from the bearing platform is greater than that of the through holes in the middle of the cleaning pipe. That is, the density of the through holes in both ends of the cleaning pipe is greater than that of the through holes in the middle of the cleaning pipe. Such arrangement of the through holes improves the cleaning efficiency of the clean gas on the bottom of the top chamber and the bottom of the bottom chamber.

Referring to FIG. 3, in one specific implementation, the cleaning pipe 201 includes an outer pipe wall 211 and an inner pipe wall 221. The width of the outer pipe wall 211 is greater than that of the inner pipe wall 221 in a plane parallel to the bearing surface. The inner pipe wall 221 is provided on the outer wall of the supporting column 101, and the outer pipe wall 211 and the supporting column 101 are provided in a nested mode. The through holes 123 are located on the outer pipe wall. The space enclosed by the outer pipe wall 211 and the inner pipe wall 221 is a cleaning pipeline of the cleaning pipe 201, the clean gas is introduced from an end of the cleaning pipe 201 away from the bearing surface, and the clean gas is leaded out from the through holes 123 for cleaning the chamber wall of the bottom chamber 120.

More specifically, in this implementation, the height of the through hole 123 at the highest position is greater than that of the contact surface of the top chamber 110 and the bottom chamber 120, that is, in the direction perpendicular to the bearing surface, the height difference between the through hole 123 at the highest position and the bearing surface is 3-10 mm. In practical application, the height difference between the through hole 123 and the bearing surface is specifically set according to the height difference between the bearing surface and the contact surface of the top chamber 110 and the bottom chamber 120, thereby ensuring that the through hole 123 at the highest position has a good cleaning effect on impurities accumulated at the bottom of the top chamber 110.

Referring to FIG. 4, in another specific implementation, in a plane parallel to the bearing surface, the width of the cleaning pipe 201 is greater than that of the supporting column 101, the cleaning pipe 201 and the supporting column 101 enclose a cleaning pipeline of the cleaning pipe 201, and the through holes 123 are located on the cleaning pipe 201. The clean gas is introduced from an end of the cleaning pipe 201 away from the bearing surface, and the clean gas is leaded out from the through holes 123 for cleaning the chamber wall of the bottom chamber 120.

More specifically, in this implementation, the density of the through holes 123 on the cleaning pipe 201 close to the bearing platform 102 is greater than that of the through holes 123 on the cleaning pipe 201 away from the bearing platform 102. That is, the number of the through holes 123 on the cleaning pipe 201 at the bottom of the bottom chamber 120 is small, and the number of the through holes 123 on the cleaning pipe 201 at the top of the bottom chamber 120 is large. Such arrangement of the through holes 123 improves the cleaning efficiency of the clean gas on the top of the bottom chamber 120.

Figure 5:
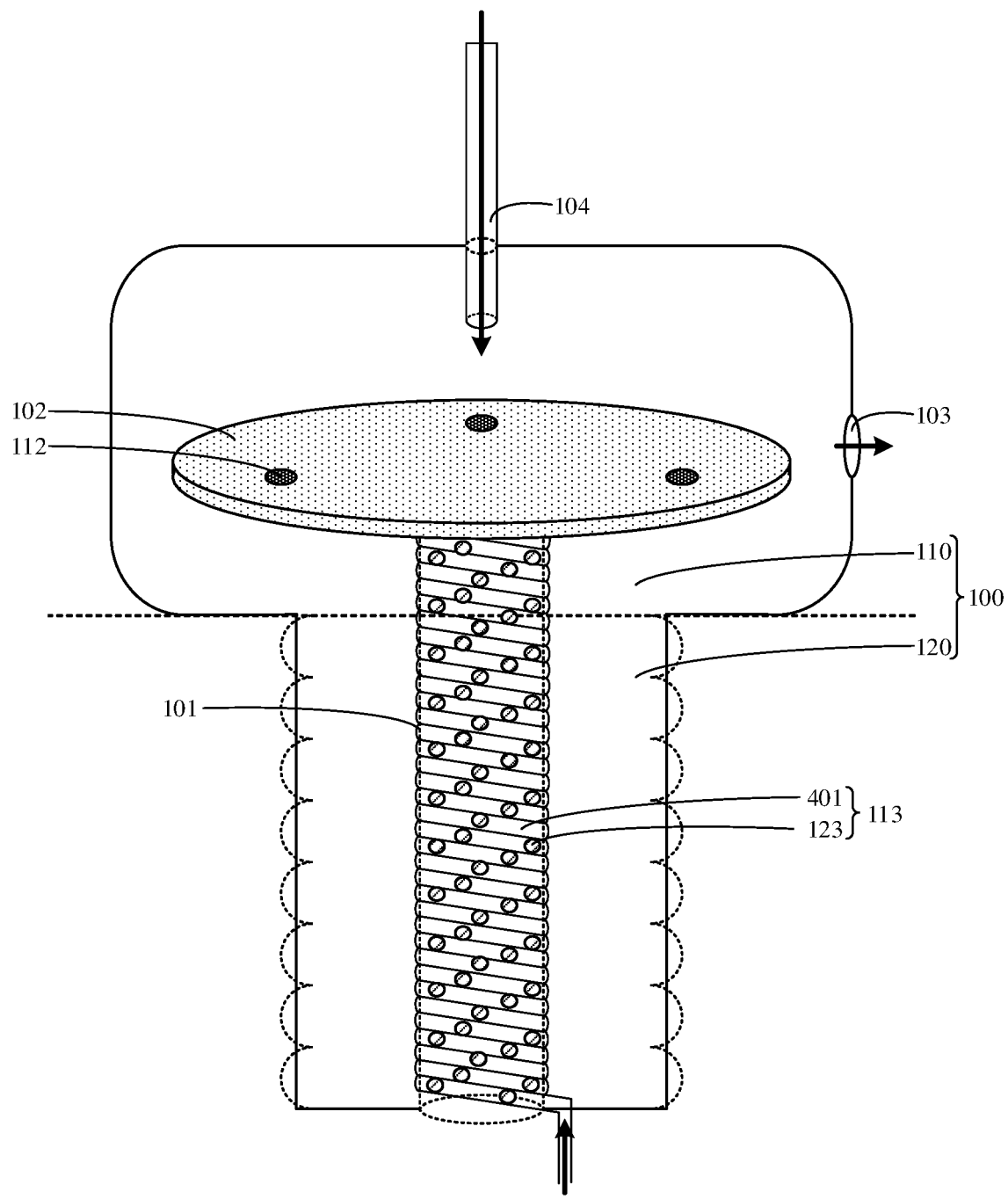

Referring to FIG. 5, in another example, the first air inlet assembly 113 includes a cleaning pipeline 401 spirally provided around the supporting column 101. The cleaning pipeline 401 has a plurality of separate through holes 123, and the through holes 123 are located on one side of the cleaning pipeline 401 close to the device chamber 100 and configured to discharge the clean gas in the cleaning pipeline 401.

In this implementation, the width of each through hole 123 and the spacing between the through holes 123 may be the same as those of the foregoing implementation, and will not be further described in this implementation. In addition, the spiral manner shown in FIG. 5 does not constitute a limitation to this embodiment, and in other embodiments, the cleaning pipe may be spirally arranged at a certain distance around the supporting column. Persons skilled in the art understand that, if there is no special effect, the cleaning pipeline 401 spirally provided around the supporting column 101 shall fall within the scope of protection of this implementation.

Figure 6:
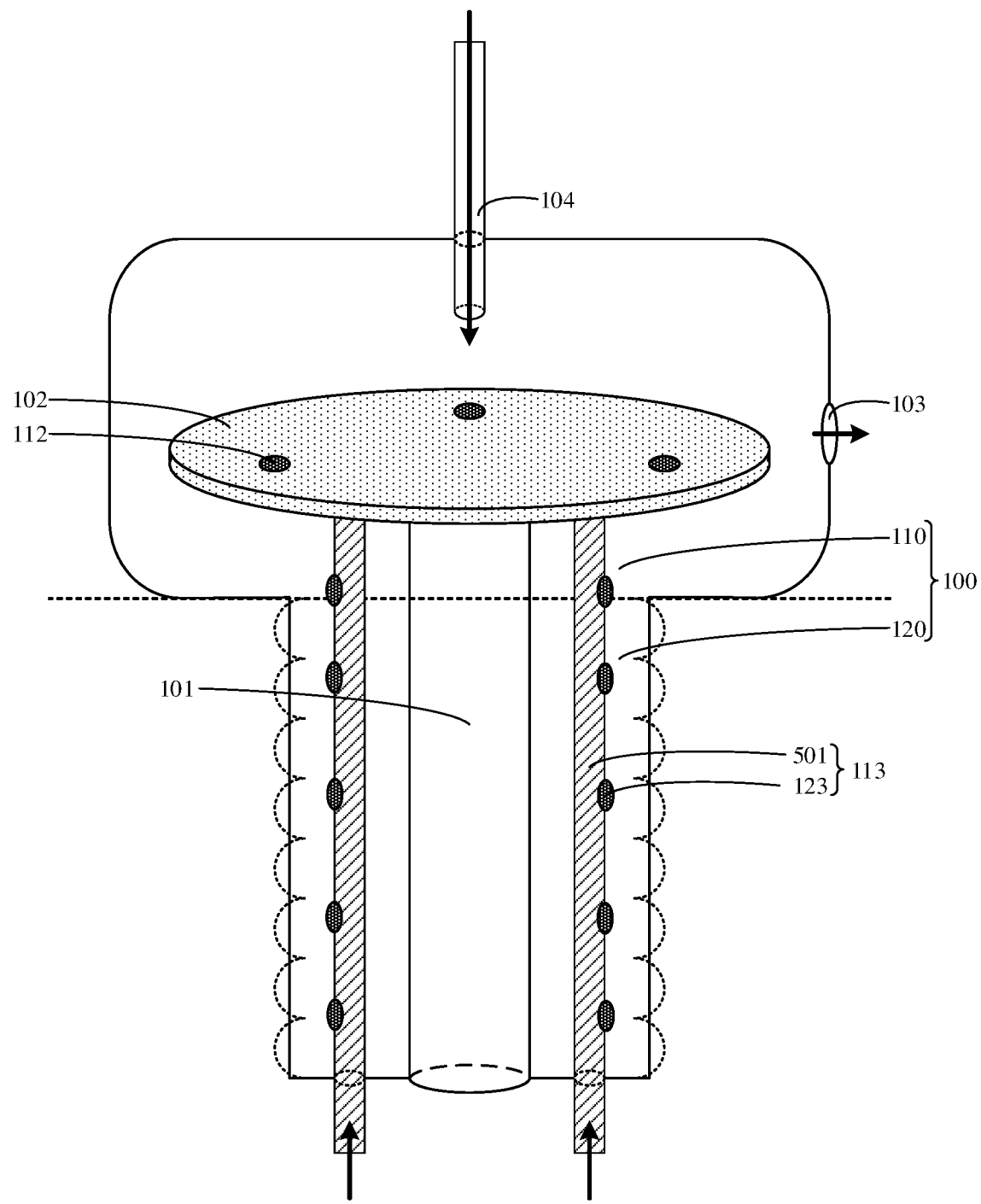
Figure 7:
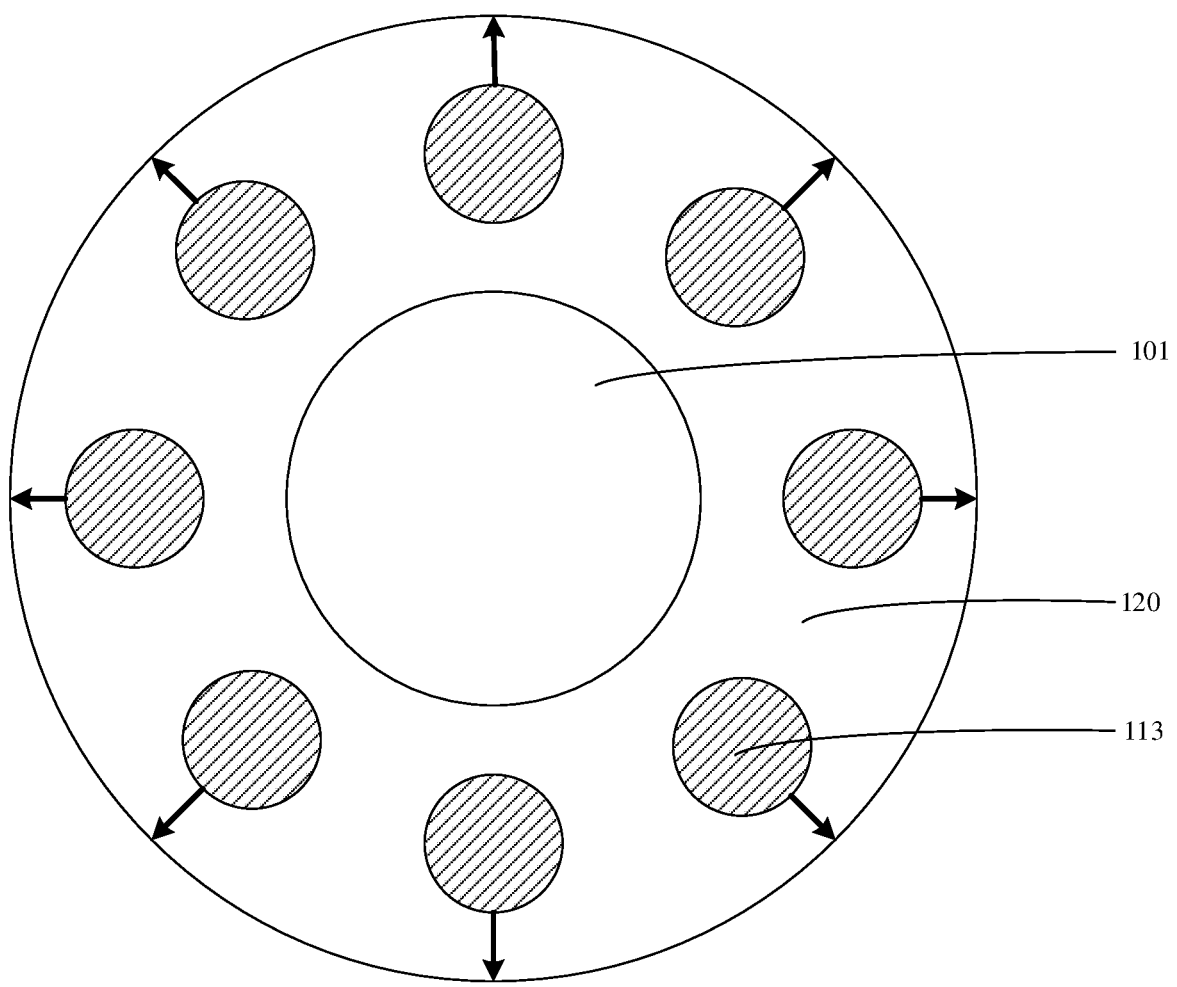
FIG. 7 is a cross-sectional view of separate cleaning pipelines provided by one embodiment of the present disclosure.

Referring to FIG. 6 and FIG. 7, in another yet example, the first air inlet assembly 113 includes a plurality of spirally provided separate cleaning pipelines 501 at a gap between the supporting column 101 and the device chamber 100. The position distribution of the cleaning pipelines 501 and the supporting column 101 is shown in FIG. 7. Referring to FIG.

6, each cleaning pipeline 501 has a plurality of separate through holes 123, and the through holes are located on one side of the cleaning pipelines 501 close to the device chamber 100 and configured to discharge the clean gas in the cleaning pipelines 501.

In this implementation, the width of each through hole 123 and the spacing between the through holes 123 may be the same as those of the foregoing implementation, and will not be further described in this implementation. In addition, the position distribution of the cleaning pipelines 501 and the supporting column 101 shown in FIG. 7 is merely illustrative of this implementation, and in other embodiments, the cleaning pipelines may be arranged between the device chamber and the supporting column more densely or more loosely.

Referring to FIG. 1, in this embodiment, the chamber wall of the bottom chamber 120 is a first telescopic structure. The first telescopic structure is connected to a control motor, and the control motor is configured to control the first telescopic structure to be elongated or shortened. Referring to FIG. 2, specifically, the control motor stretches or extrudes the first telescopic structure in a direction perpendicular to the bearing surface, so that the first telescopic structure is elongated or shortened in the direction perpendicular to the bearing surface. More specifically, the control motor stretches the first telescopic structure in the direction perpendicular to the bearing surface, and the first telescopic structure is elongated in the direction perpendicular to the bearing surface; and the control motor extrudes the first telescopic structure in the direction perpendicular to the bearing surface, and the first telescopic structure is shortened in the direction perpendicular to the bearing surface.

Also with reference to FIG. 1, the bottom chamber 120 is the first telescopic structure. By controlling the stretching or shortening of the first telescopic structure to change the positions of the supporting column 101 and the bearing platform 102 relative to the device chamber 100, originally hidden corners in the device chamber 100 are exposed, and the clean gas dynamically cleans the device chamber 100, thereby improving the cleaning effect on the device chamber 100.

Specifically, in the process of introducing the clean gas into the device chamber 100 by the first air inlet assembly 113 and the second air inlet assembly 104, by controlling the stretching or shortening of the first telescopic structure to change the positions of the supporting column 101 and the bearing platform 102 relative to the device chamber 100, all positions of the device chamber 100 are exposed in the clean gas, and the clean gas dynamically cleans the device chamber 100, thereby improving the cleaning effect on the device chamber 100.

In an example, the first telescopic structure is a corrugated pipe. It is to be noted that the corrugated pipe serves as the chamber wall of the bottom chamber 120 to realize expansion/contraction of the bottom chamber, which does not constitute a limitation to this embodiment. In other embodiments, the chamber wall of the bottom chamber may be made of an elastic material, thereby achieving expansion/contraction of the bottom chamber.

In this embodiment, an air inlet pipeline of the first air inlet assembly 113 is further included, and the air inlet pipeline is configured to convey the clean gas into the first air inlet assembly 113.

Referring to FIG. 1, the air inlet pipeline is provided with a second telescopic structure 133, and the first telescopic structure is elongated or shortened to drive the second telescopic structure 133 to be elongated or shortened. Specifically, the second telescopic structure 133 is also connected to the control motor, and the control motor is configured to control the second telescopic structure 133 to be elongated or shortened. Specifically, the control motor stretches or extrudes the second telescopic structure 133 in the direction perpendicular to the bearing surface to enable the second telescopic structure 133 to be elongated or shortened in the direction perpendicular to the bearing surface. More specifically, when the first telescopic structure is elongated, the control motor stretches the second telescopic structure 133 in the direction perpendicular to the bearing surface, and the second telescopic structure is elongated in the direction perpendicular to the bearing surface; and when the first telescopic structure is shortened, the control motor extrudes the second telescopic structure 133 in the direction perpendicular to the bearing surface, and the second telescopic structure 133 is shortened in the direction perpendicular to the bearing surface. Through the second telescopic structure 133, the air inlet pipeline may be stretched along with stretching of the bottom chamber 120, and extruded along with extrusion of the bottom chamber 120, so that the stability of the first air inlet assembly 113 and the air inlet pipeline is ensured.

In an example, the second telescopic structure 133 is a corrugated pipe. It is to be noted that the corrugated pipe serves as the second telescopic structure to realize the stability of the air inlet pipeline and the first air inlet assembly 113, which does not constitute a limitation to this embodiment. In other embodiments, the second telescopic structure may be made of an elastic material, thereby achieving expansion/contraction of the second telescopic structure.

In addition, in this embodiment, the second telescopic structure 133 is made of aluminum. Since aluminum is a common metal and is easy to obtain, and aluminum has low density, thereby reducing the weight of the air inlet pipeline and avoiding the falling of the air inlet pipeline and the first air inlet assembly 113. In other embodiments, the second telescopic structure may also be made of gallium alloy.

In addition, in this embodiment, the second telescopic structure 133 is connected to the air inlet pipeline through a vacuum connection radial sealing joint. Through connection of the vacuum connection radial sealing structure, the clean gas is prevented from leakage during conveying to the first air inlet assembly 113, thereby saving the cleaning costs.

Compared with the related art, the device chamber on the upper and lower sides of the bearing surface is respectively provided with the first air inlet assembly and the second air inlet assembly. The first air inlet assembly and the air outlet form a first airflow circulation, the second air inlet assembly and the air outlet form a second airflow circulation, and the first airflow circulation and the second airflow circulation are configured to clean the device chamber on the upper and lower sides of the bearing surface respectively, thereby realizing simultaneous removal of top contamination and bottom contamination of the device chamber, i.e., completing the cleaning of the bottom gap of the machine without stopping the machine, so that the production efficiency of the product is not reduced.

Another embodiment of the present disclosure relates to a cleaning system, in addition to the semiconductor device, further including: an air supply device and an air suction pump, the air supply device being configured to supply clean gas. The air supply device is connected to a first air inlet assembly and a second air inlet assembly of the semiconductor device and is configured to introduce the clean gas into the device chamber of the semiconductor device; and an air suction pump is connected to an air outlet of the semiconductor device and is configured to suction out gas in the device chamber.

FIG. 1 is a schematic structural diagram of the semiconductor device. The cleaning system provided by this embodiment is described in details in conjunction with the accompanying drawings. Parts which are the same as the forgoing embodiments are not described in detail in this embodiment.

The cleaning system includes: the semiconductor device provided by the forgoing embodiments (referring to FIG. 1), the air supply device, and the air suction pump, the air supply device being configured to supply clean gas. The air supply device is connected to the first air inlet assembly 113 and the second air inlet assembly 104 of the semiconductor device and configured to introduce clean gas into the device chamber 100 of the semiconductor device. The air suction pump is connected to the air outlet 103 of the semiconductor device and configured to suction out the gas in the device chamber 100. The air supply device is connected to the first air inlet assembly 113 and the second air inlet assembly 104, and the air suction pump is connected to the air outlet 103, so that the clean gas supplied by the air supply device forms a first airflow circulation between the first air inlet assembly 113 and the air outlet 103, and forms a second airflow circulation between the second air inlet assembly 104 and the air outlet 103. The first airflow circulation and the second airflow circulation are configured to clean the device chamber 100 on the upper and lower sides of the bearing surface respectively, thereby realizing simultaneous removal of top contamination and bottom contamination of the device chamber 100.

In this embodiment, the clean gas includes Ar plasma and $NF_3$ plasma. Specifically, the contaminant impurities accumulated in the device chamber 100 are mainly $SiO_2$ or $Si_xN_y$. The Ar plasma introduced into the device chamber 100 bombards the impurities, causing the impurities attached to the device chamber 100 to fall off. The $NF_3$ plasma introduced into the device chamber 100 reacts with the impurities. The reaction equations are as follows:

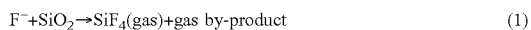
$$F^-+SiO_2 \rightarrow SiF_4(gas)+\text{gas by-product} \quad (1)$$

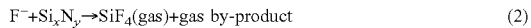
$$F^-+Si_xN_y \rightarrow SiF_4(gas)+\text{gas by-product} \quad (2)$$

The $NF_3$ plasma introduced into the device chamber 100 and the falling solid impurities may undergo a chemical reaction, the solid impurities are converted into gaseous impurities, and the gaseous impurities are suctioned from the air outlet 103 of the device chamber 100, thereby completing the cleaning of the contaminant impurities accumulated in the device chamber 100.

It is to be noted that the clean gas is Ar plasma and $NF_3$ plasma, which does not constitute a limitation to this embodiment, except for the purpose of illustrating the clean gas being a component of the plasma, and how to implement a cleaning process for impurities accumulated in the device chamber 100. In other embodiments, the specific components of the plasma may be selected according to the components of the contaminant impurities in the device chamber.

In addition, in this embodiment, the cleaning system further includes a control motor, connected to the first telescopic structure and configured to stretch or extrude the first telescopic structure in a direction perpendicular to the bearing surface, so that the first telescopic structure is elongated or shortened in the direction perpendicular to the bearing surface.

Specifically, the control motor stretches or extrudes the first telescopic structure in the direction perpendicular to the bearing surface, so that the first telescopic structure is elongated or shortened in the direction perpendicular to the bearing surface. More specifically, the control motor stretches the first telescopic structure in the direction perpendicular to the bearing surface, and the first telescopic structure is elongated in the direction perpendicular to the bearing surface; and the control motor extrudes the first telescopic structure in the direction perpendicular to the bearing surface, and the first telescopic structure is shortened in the direction perpendicular to the bearing surface. The control motor controls the stretching or shortening of the first telescopic structure to change the positions of the supporting column 101 and the bearing platform 102 relative to the device chamber 100, so that originally hidden corners in the device chamber 100 are exposed, and the clean gas dynamically cleans the device chamber 100, thereby improving the cleaning effect on the device chamber 100.

Compared with the related art, the air supply device is connected to the first air inlet assembly and the second air inlet assembly, and the air suction pump is connected to the air outlet, so that the clean gas supplied by the air supply device forms a first airflow circulation between the first air inlet assembly and the air outlet, and forms a second airflow circulation between the second air inlet assembly and the air outlet; and the first airflow circulation and the second airflow circulation are configured to clean the device chamber on the upper and lower sides of the bearing surface respectively, thereby realizing simultaneous removal of top contamination and bottom contamination of the device chamber, i.e., completing the cleaning of the bottom gap of the machine without stopping the machine, so that the production efficiency of the product is not reduced.

Compared with the related art, the device chamber on the upper and lower sides of the bearing surface is respectively provided with the first air inlet assembly and the second air inlet assembly. The first air inlet assembly and the air outlet form a first airflow circulation, the second air inlet assembly and the air outlet form a second airflow circulation, and the first airflow circulation and the second airflow circulation are configured to clean the device chamber on the upper and lower sides of the bearing surface respectively, thereby realizing simultaneous removal of top contamination and bottom contamination of the device chamber, i.e., completing the cleaning of the bottom gap of the machine without stopping the machine, so that the production efficiency of the product is not reduced.

Compared with the related art, the air supply device is connected to the first air inlet assembly and the second air inlet assembly, and the air suction pump is connected to the air outlet, so that the clean gas supplied by the air supply device forms a first airflow circulation between the first air inlet assembly and the air outlet, and forms a second airflow circulation between the second air inlet assembly and the air outlet; and the first airflow circulation and the second airflow circulation are configured to clean the device chamber on the upper and lower sides of the bearing surface respectively, thereby realizing simultaneous removal of top contamination and bottom contamination of the device chamber, i.e., completing the cleaning of the bottom gap of the machine without stopping the machine, so that the production efficiency of the product is not reduced.

Since the forgoing embodiments correspond to this embodiment, this embodiment may be implemented in conjunction with the forgoing embodiments. The relevant technical details mentioned in the forgoing embodiments are still valid in this embodiment. The technical effects that can be achieved in the forgoing embodiments may also be implemented as well in this embodiment. In order to reduce repetition, the description is not repeated here. Accordingly, the relevant technical details mentioned in this embodiment can also be applied to the forgoing embodiments.

Those skilled in the art can understand that the forgoing embodiments are specific embodiments for implementing the present disclosure. However, in practical application, various changes may be made in form and detail without departing from the spirit and scope of the present disclosure.

The invention claimed is:

1. A semiconductor device, comprising:
a device chamber, and a supporting column and a bearing platform located in the device chamber, the supporting column being configured to support the bearing platform; and
an air outlet, a first air inlet assembly and a second air inlet assembly provided on the device chamber, the first air inlet assembly and the second air inlet assembly being configured to introduce clean gas into the device chamber, and the air outlet being configured to discharge gas in the device chamber; and, wherein
the first air inlet assembly comprises: a cleaning pipe nested on the supporting column, the cleaning pipe has a plurality of separate through holes, and the through holes are configured to discharge the clean gas in the cleaning pipe;
wherein the first air inlet assembly and the second air inlet assembly are separately provided on the device chamber on upper and lower sides of a bearing surface of the bearing platform; and one of the first air inlet assembly and the second air inlet assembly is configured to clean the device chamber on a side of the bearing surface away from the supporting column, and other assembly is configured to clean a gap between the supporting column and the device chamber.

2. The semiconductor device of claim 1, wherein the cleaning pipe comprises an outer pipe wall and an inner pipe wall; a width of the outer pipe wall is greater than that of the inner pipe wall in a plane parallel to the bearing surface; the inner pipe wall is provided on an outer wall of the supporting column, and the outer pipe wall is nested on the supporting column; and the through holes are located on the outer pipe wall.

3. The semiconductor device of claim 2, wherein a spacing between the through holes is 10-20 mm.

4. The semiconductor device of claim 3, wherein a density of the through holes on the cleaning pipe close to the bearing platform is greater than that of the through holes on the cleaning pipe away from the bearing platform.

5. The semiconductor device of claim 3, wherein in a direction perpendicular to the bearing surface, a difference between a height of the through hole at the highest position and a height of the bearing surface is 3-10 mm.

6. The semiconductor device of claim 2, wherein a width of each through hole is 3-7 mm.

7. The semiconductor device of claim 1, wherein a width of the cleaning pipe is greater than that of the supporting column in a plane parallel to the bearing surface, a cleaning pipeline is defined by the cleaning pipe and the supporting column, and the through holes are located on the cleaning pipe.

8. The semiconductor device of claim 1, wherein the first air inlet assembly comprises:
a cleaning pipeline spirally provided around the supporting column;
the cleaning pipeline has a plurality of separate through holes, and the through holes are located on one side of the cleaning pipeline close to the device chamber and configured to discharge the clean gas in the cleaning pipeline.

9. The semiconductor device of claim 1, wherein the first air inlet assembly comprises:
a plurality of separate cleaning pipelines spirally provided between the supporting column and the device chamber;
each cleaning pipeline has a plurality of separate through holes, and the through holes are located on one side of the cleaning pipeline close to the device chamber and configured to discharge the clean gas in the cleaning pipeline.

10. The semiconductor device of claim 1, wherein:
the device chamber comprises a top chamber and a bottom chamber, and a width of the top chamber is greater than that of the bottom chamber in a plane parallel to the bearing surface;
the bearing platform is located in the top chamber, the supporting column is partially located in the top chamber and partially located in the bottom chamber, and a size of the supporting column is less than that of the bearing platform in a plane parallel to the bearing surface; and
the first air inlet assembly or the second air inlet assembly for cleaning the gap between the supporting column and the device chamber is further configured to clean a bottom of the top chamber.

11. The semiconductor device of claim 10, wherein the first air inlet assembly is provided at the bottom of the bottom chamber, and the second air inlet assembly is provided at top of the top chamber.

12. The semiconductor device of claim 1, wherein:
the device chamber comprises a top chamber and a bottom chamber;
a chamber wall of the bottom chamber is a first telescopic structure; and
the first telescopic structure is connected to a control motor, and the control motor stretches or extrudes the first telescopic structure in a direction perpendicular to the bearing surface, so that the first telescopic structure is elongated or shortened in the direction perpendicular to the bearing surface.

13. The semiconductor device of claim 12, wherein the first telescopic structure is a corrugated pipe.

14. The semiconductor device of claim 12, further comprising: an air inlet pipeline connected to the first air inlet assembly, wherein the air inlet pipeline is provided with a second telescopic structure, and the first telescopic structure is elongated or shortened to drive the second telescopic structure to be elongated or shortened.

15. The semiconductor device of claim 14, wherein the second telescopic structure is a corrugated pipe.

16. The semiconductor device of claim 14, wherein the second telescopic structure is made of an aluminum or gallium alloy.

17. The semiconductor device of claim 14, wherein the second telescopic structure is connected to the air inlet pipeline through a vacuum connection radial sealing joint.

* * * * *